US009817028B2

(12) United States Patent
Xie et al.

(10) Patent No.: US 9,817,028 B2
(45) Date of Patent: Nov. 14, 2017

(54) TERAHERTZ TRANSMISSION CONTACTLESS PROBING AND SCANNING FOR SIGNAL ANALYSIS AND FAULT ISOLATION

(71) Applicant: Intel Corporation, Santa Clara, CA (US)

(72) Inventors: Mayue Xie, Phoenix, AZ (US);
Hemachandar Tanukonda Devarajulu, Chandler, AZ (US);
Deepak Goyal, Phoenix, AZ (US)

(73) Assignee: Intel Corporation, Santa Clara, CA (US)

( * ) Notice: Subject to any disclaimer, the term of this patent is extended or adjusted under 35 U.S.C. 154(b) by 228 days.

(21) Appl. No.: 14/866,221

(22) Filed: Sep. 25, 2015

(65) Prior Publication Data
US 2017/0089951 A1   Mar. 30, 2017

(51) Int. Cl.
*G01R 1/07* (2006.01)
*G01R 31/303* (2006.01)
*G01R 31/311* (2006.01)

(52) U.S. Cl.
CPC ........... *G01R 1/071* (2013.01); *G01R 31/303* (2013.01); *G01R 31/311* (2013.01)

(58) Field of Classification Search
CPC .......... G01R 31/31937; G02B 6/12007; G01Q 20/04
See application file for complete search history.

(56) References Cited

U.S. PATENT DOCUMENTS

| 6,833,716 B1 * | 12/2004 | Goruganthu ......... G01R 31/311 324/754.06 |
| 7,280,190 B1 | 10/2007 | Wang et al. |
| 2008/0122463 A1 * | 5/2008 | Dabral ................... G01R 1/071 324/754.23 |
| 2009/0051938 A1 * | 2/2009 | Miousset ............. G01B 11/245 356/625 |

* cited by examiner

*Primary Examiner* — Jermele M Hollington
*Assistant Examiner* — Alvaro Fortich
(74) *Attorney, Agent, or Firm* — Schwegman Lundberg & Woessner, P.A.

(57) ABSTRACT

An apparatus comprises a contactless sense probe, an electro optic sensor module, and a test signal emitter circuit. The contactless sense probe includes a photoconductive switch and the signal bandwidth of the photoconductive switch is variable. The test signal emitter circuit configured to apply a test signal to a device under test (DUT) at a first location of the DUT, wherein the test signal includes a test signal frequency. The electro-optic sensor module is coupled to the contactless sense probe and configured to: generate an impulse signal at the contactless sense probe using an optical signal input to the first photoconductive switch; sense the test signal frequency in the impulse signal using the contactless sense probe at a second location of the DUT; and generate an indication of a defect in the DUT when the test signal frequency is undetected in the impulse signal.

25 Claims, 6 Drawing Sheets

TERAHERTZ TRANSMISSION CONTACTLESS PROBING AND SCANNING FOR SIGNAL ANALYSIS AND FAULT ISOLATION

TECHNICAL FIELD

Embodiments pertain to testing of integrated circuits or ICs. Some embodiments relate to detecting defects in multi-chip modules (MCMs).

BACKGROUND

The demand for increased functionality in small consumer electronic products such as smartphones and tablet computers continues the drive to decreased feature sizes of integrated circuits (ICs) and increased complexity of electronic packaging. For example, current electronic packaging can include, among other things, embedded silicon bridge multi-chip modules (MCMs) and package on package (PoP) multidimensional packaging in which multiple integrated circuit dice can be packaged horizontally and vertically. The packaged components can include one or more processors, memory such as dynamic random access memory (DRAM), and analog circuits such as radio frequency (RF) circuits and other special function devices. These advanced packaging technologies provides challenges to manufacturers of ICs, including testing, debug, and failure analysis of the devices in these complex electronic packages.

DETAILED DESCRIPTION

The following description and the drawings sufficiently illustrate specific embodiments to enable those skilled in the art to practice them. Other embodiments may incorporate structural, logical, electrical, process, and other changes. Portions and features of some embodiments may be included in, or substituted for, those of other embodiments. Embodiments set forth in the claims encompass all available equivalents of those claims.

As explained previously herein, advanced electronic packaging technologies provide challenges to the manufacturers. One of the challenges is to identify the failing component for a defective or non-functional packaged device. This allows faulty components to be replaced and allows for analysis of the manufacturing process to identify the source of the problem. Traditional methods have relied on destructive analysis to identify which component is defective. However, destructive analysis is slow and causes higher yield cost.

More recently, time domain reflectometry (TDR) has been used to isolate defects in integrated circuits or small-sized packages. TDR is a technology that can be used to determine the condition of electrical conductors such as electrically conductive lines or paths of an electronic device. A signal pulse (e.g., a step function waveform) is provided to a conductor using a probe and the signal reflected back to the probe from the device is analyzed to determine the condition of the conductor. The waveform of the reflected signal can provide information of the condition of the conductor. For instance, the shape of the reflected signal waveform for a functional part will be different from the waveform of a part having a short or open in the conductor.

Electro-optic time domain reflectometry is another approach to defect isolation in integrated circuits. An optical signal is provided to an electro-optic probe where the optical signal is converted to an electrical signal which is applied to a device under test (DUT). A defect in the DUT reflects a signal that affects an electro-optic crystal at the electro-optic probe. For instance, an optical sampling signal provided to the electro-optic probe may experience a change in polarization due to a reflected electrical signal incident to the electro-optic crystal. Analysis of the polarized optical sampling signal can provide information on the location of defects in the DUT. Electro-optic time-domain pulse reflectometry (EOTPR) uses a fermi-second laser pulse to generate an electrical test signal that includes terahertz electric pulses. Pulses reflected by the DUT are detected in the optical sampling signal.

Figure 1:
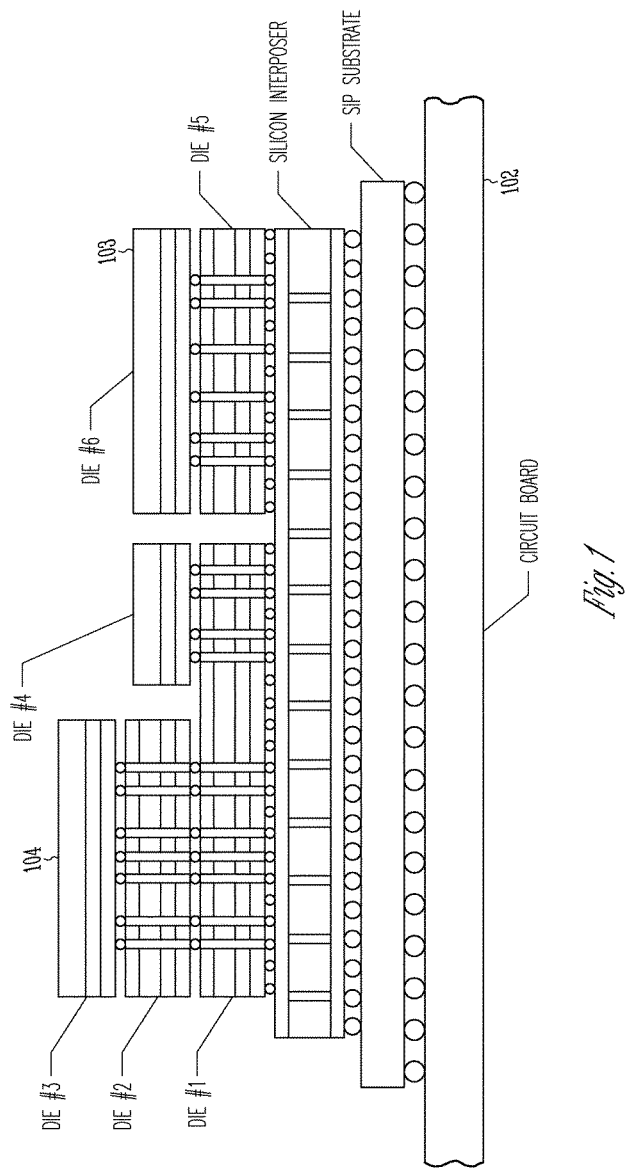
FIG. 1 illustrates an example of a complex electronic package.

FIG. 1 illustrates an example of a complex electronic package. The example shows that a complex package may include multiple IC dice incorporated in one or both of a vertical direction and a horizontal direction, as well as one or more silicon interposers mounted on a substrate that may be included on a printed circuit board (PCB). The electronic packages include conductive signal routing that can include, among other things, vias, through silicon vias (TSVs), first level interconnect (FLI), midlevel interconnect (MLI), etc. EOTPR can be less effective for such complex electronic packaging as shown in FIG. 1. EOTPR may be limited to individual ICs or to small electronic packages due to lack of signal power of the test signals involved to extend to larger packages, and due to distortion of the test signals when the length of the conductors under test are increased as in the more complex electronic packaging.

Figure 2:
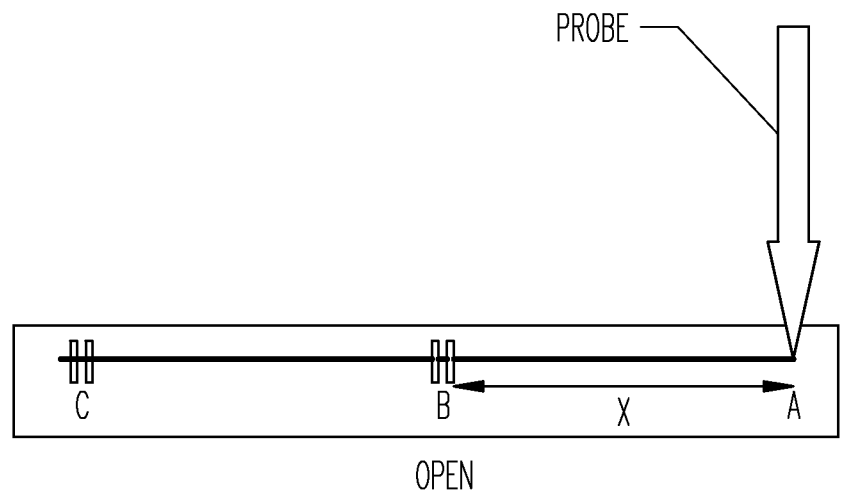
FIG. 2 illustrates an example of detecting a defect in a device under test using a single probe approach of electro-optic time domain reflectometry.

FIG. 2 illustrates an example of detecting a defect in a DUT using a single probe approach of electro-optic time domain reflectometry. The example shows an electro-optic probe in contact with the DUT at point "A" of a DUT. At point "B" and point "C" of the DUT are devices flaws (e.g., an open circuit in a conductor). If point "B" represents the maximum distance that the electro-optic time domain reflectometry system can detect a flaw because of degradation of the reflected signal, then the flaw at point "C" will not be detected by the system because the reflected signal will be too degraded by the time it arrives at point "A." Referring again to the example of FIG. 1, it can be seen that detection of defects in such a complicated package can be limited by conventional EOTPR.

Figure 3:
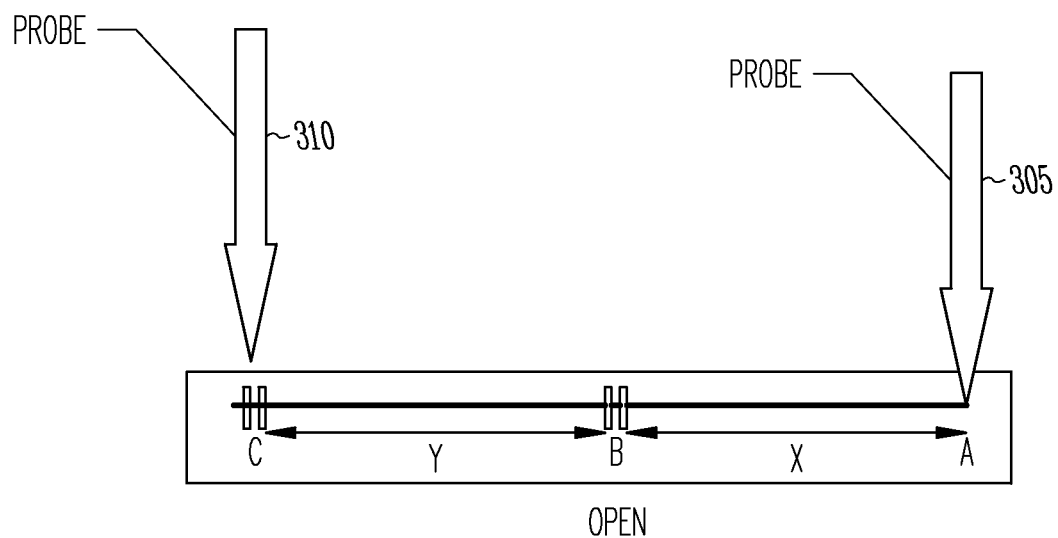
FIG. 3 illustrates an example of detecting a defect in a device under test using an approach where the test signal generating is separated from the sense signal generating.

FIG. 3 illustrates an example of detecting a defect in a DUT using an approach where the test signal generating is separated from the sense signal generating. The example of FIG. 3 includes an emitter probe 305 and a contactless sense probe 310. The flaw at point "B" will be detected when the detector probe is positioned at or near position "B," and the flaw at point "C" will be detected when the detector probe is positioned at or near position "C." Because the example shown does not use a reflected signal to detect defects, defects can be detected at a greater range before being limited by signal distortion.

Figure 4:
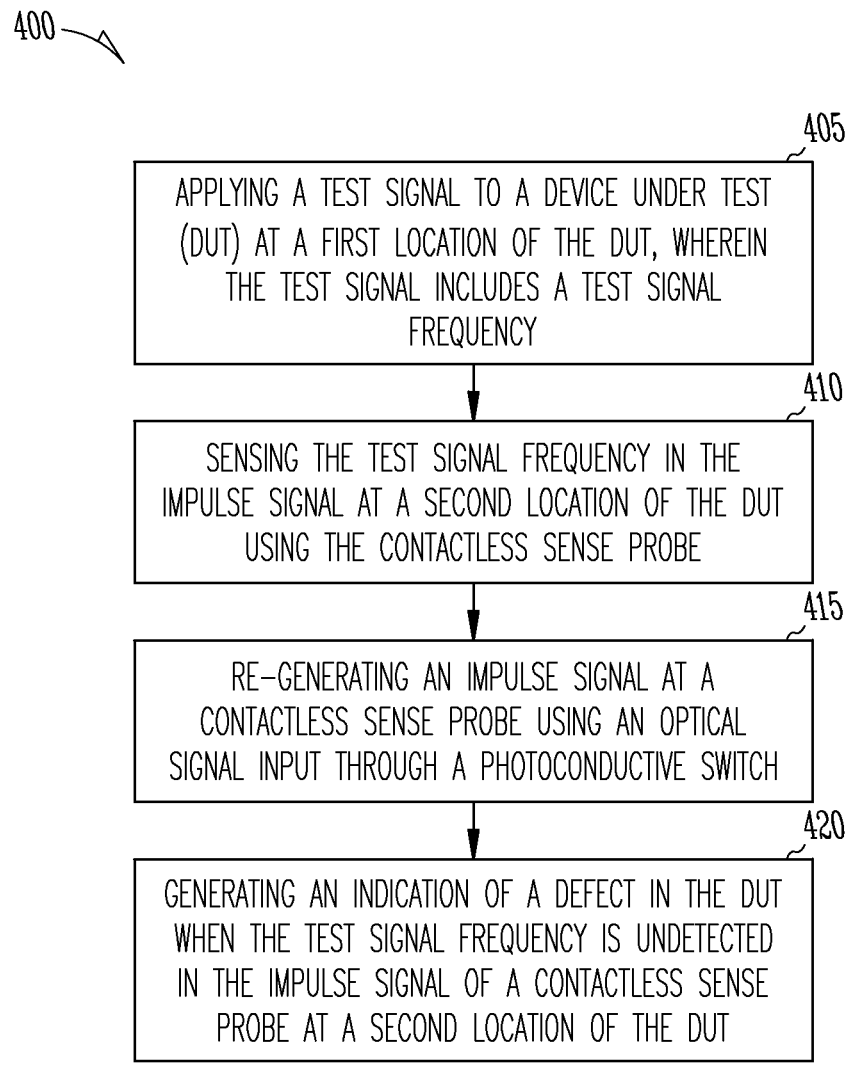
FIG. 4 is a flow diagram of an example a method of detecting defects in a device under test.

FIG. 4 is a flow diagram of an example a method 400 of isolating defects in a DUT. At 405, a test signal is applied to the DUT at a first location of the DUT. The test signal may be applied by direct contact between a test signal emitter circuit and a conductor of the DUT, or the test signal may be coupled to the conductor electromagnetically so that direct contact is not required. For example, an emitter probe may be driven with a test signal having a test signal frequency. The test signal frequency and amplitude may cause the test signal to be coupled by an electromagnetic field to a conductor of the DUT without direct contact of the emitter probe. Sensing is then performed at a second location of the DUT to sense the applied test signal.

At 410, if the test signal traverses the conductors of the DUT from the first location to the second location where the contactless sense probe is positioned, the test signal can be sensed using the contactless sense probe. If there is a defect in the conductors (e.g., an open circuit, a short circuit, etc.), the test signal will not reach the second location. In certain examples, the test signal is sensed by detecting a signal artifact having the frequency of the test signal.

At 415, an impulse signal is re-generated or re-constructed at the contactless sense probe using an optical signal. The impulse signal can be used to sense the test signal applied to the DUT by the test signal modifying the impulse signal. For instance, an electromagnetic field caused at the second location by the test signal being applied at the first location may modify the impulse signal. The electromagnetic field may modify the impulse signal so that the frequency of the test signal is evident in the impulse signal (e.g., the phase of the impulse signal may be modulated at the frequency of the test signal). In some embodiments, the electromagnetic field generated by the test signal modulates the phase of the impulse signal. The impulse signal may be modified so that the frequency of the test signal is evident in the modified impulse signal. The contactless sense probe can include a photoconductive switch to convert the optical signal to an electrical signal at the contactless sense probe. Modification of the impulse signal can be detected in the generated electrical signal.

At 420, an indication of a defect in the DUT is generated when the test signal frequency is undetected in the impulse signal of a contactless sense probe at a second location of the DUT. In certain variations, the indication is a logic signal. In certain variations, the indication is provided to a process executing on a test system. In certain variations, the indication is provided to a user, such as by presenting the indication of a defect on a test system display.

Figure 5:
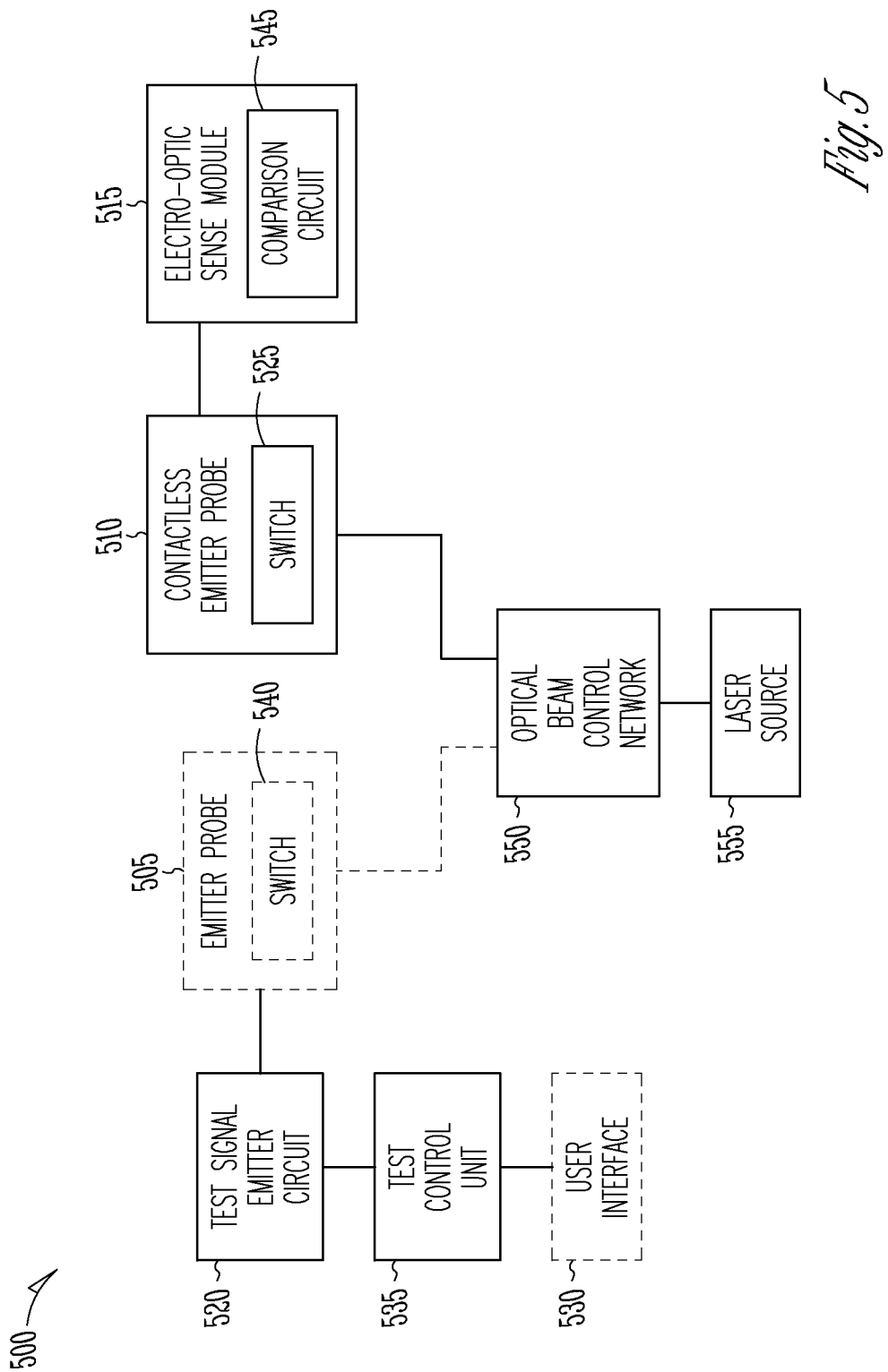
FIG. 5 is a block diagram of an example of a device to locate or isolate defects in a device under test.

FIG. 5 is a block diagram of an example of a device 500 to locate or isolate defects in a DUT. The device 500 includes a contactless sense probe 510, an electro-optic sensor module 515, and a test signal emitter circuit 520. The test signal emitter circuit 520 applies a test signal to the DUT at a first location of the DUT. In some embodiments, the test signal emitter circuit 520 is electrically coupled to an emitter probe 505, and the test signal is applied with the emitter probe by contacting a conductor of the DUT.

The contactless sense probe 510 includes a photoconductive switch 525. The contactless sense probe 510 can be an electro-optic contactless probe and is electrically coupled to an electro-optic sensor module 515 that generates an impulse signal at the contactless sense probe 510. The electro-optic sensor module 515 generates the impulse signal using an optical impulse signal input to the photoconductive switch 525 of the contactless sense probe 510. The device 500 may include an optical beam control network 550 coupled to the contactless sense probe 510 through one or more optical fibers. The optical beam control network 550 can include optical elements to receive a laser signal from a laser source 555 and apply the laser signal to the optical fibers.

In certain embodiments, the electro-optic contactless probe includes an optical fiber to provide an incident optical signal to a reflecting surface. At least a portion of the incident optical signal is reflected by the reflecting surface to generate the optical sense signal. The photoconductive switch may receive the reflected portion of the incident optical signal and convert the reflected portion of the incident optical signal into the electrical sense signal.

The optical impulse signal and the photoconductive switch 525 act as a detector for the test signal. For example, the contactless sense probe 410 with the photoconductive switch can be positioned at a sensing location of the electronic package of FIG. 1 (e.g., Die #3 104 in FIG. 1) and the optical impulse signal is applied to the photoconductive switch 525 of the contactless sense probe for conversion to an electrical impulse signal. The test signal can be applied by the emitter circuit at a different location of the electronic package (e.g., the PCB 102 of FIG. 1). In some embodiments, the test signal is applied at a fixed location using a test probe and may make contact with a pad of the DUT. The electrical field of the test signal modifies the optical impulse signal at the contactless sense probe 510. The photoconductive switch 525 converts the optical impulse signal to an electrical impulse signal. The modification to the optical impulse signal is evident in the generated electrical signal and can be detected through signal analysis. The contactless sense probe 510 can be movable to multiple locations of the DUT for scanning to check for defects at the multiple locations.

In some embodiments, the electro-optic sensor module 515 applies a pulsed laser signal to the photoconductive switch 525 of the contactless sense probe 510. In some embodiments, the optical impulse signal may be a pulsed laser signal that includes femtosecond laser pulses. The test signal is high frequency (e.g., in the gigahertz GHz range), but the frequency of the test signal may be lower than the frequency of the laser signal (e.g., the frequency of the laser signal may be in the terahertz THz range).

In some embodiments, the electrical field of the test signal arriving at the contactless sense probe changes or modulates the phase of the optical impulse signal. Because the electrical impulse signal is converted from the optical impulse signal, the electrical impulse signal also is phase modulated when the test signal interacts with the optical impulse signal. The phase modulation of the electrical impulse signal is detected by the electro-optic sensor module 515. If the conductive path between the two locations of the electronic package is good or defect-free, the test signal will phase modulate the impulse signal. The phase modulation will vary with the frequency of the electrical test signal, and the test signal frequency will be sensed using the impulse signal. If there is a flaw in the conductive path, the test signal will not arrive at the photoconductive switch and the sensed impulse signal will not be modified from the original impulse signal. The electro-optic sensor module 515 may generate an indication of a defect in the DUT when the test signal frequency is undetected in the impulse signal.

The electro-optic sensor module 515 may include a comparison circuit 545 configured to compare a sensed impulse signal to a baseline sense signal expected from a DUT without defect. In some variations, a representation of the baseline signal is stored in memory. The comparison circuit 545 may calculate a measure of the difference between the sensed impulse signal and the baseline sense signal. The electro-optic sensor module 515 may generate the indication of a defect when the sensed impulse signal differs from the baseline sense signal by more than a threshold signal difference. Alternatively, the baseline sense signal may represent the original impulse signal expected when the test signal does not modify the original impulse signal. The electro-optic sensor module 515 may generate the indication of a defect when the sensed impulse signal is the same as the original impulse signal.

According to some embodiments, the test signal provides a bias to the photoconductive switch 525 which is activated by the optical signal. Current induced in the activated photoconductive switch can be detected by the electro-optic sensor module 515. In certain embodiments, electro-optic sensor module 515 includes a circuit to convert the induced current to a voltage that can be sampled and analyzed by the electro-optic sensor module 515 using signal processing techniques. As explained previously herein, the test signal may have a test signal frequency greater than or equal to 1 GHz. The optical signal is a pulsed laser signal that includes femto second laser pulses. If the conductive path between the two locations of the electronic package is good or defect-free, the test signal will bias the photoconductive switch 525 of the contactless sense probe 510 with the test signal frequency and current from the photoconductive switch activated in femto second pulses will be detected. If there is a flaw in the conductive path, the test signal will not arrive at the photoconductive switch and current will not be induced using the photoconductive switch 525 and current will be undetected.

As explained previously herein, because a reflected signal is not used by the device of FIG. 5 to detect defects in the DUT, defects can be detected at a greater range before being limited by signal distortion. The example of a complex electronic package of FIG. 1, shows that the distance between the location where the test signal is applied and the location where the contactless sense probe is positioned can vary significantly. Also, the type of structures encountered between locations can vary. Different test signals may be more suitable for isolating different defects. For example, if the distance between locations on the electronic package is relatively large (e.g., the distance between the PCB 102 and Die #6 103), the test signal applied by the test signal emitter circuit 520 may have higher power and lower frequency. This type of test signal may travel many different structures such as the package substrate, the silicon interposer, FLI, and stacked IC dice. If the test signal does not need to travel as far, the test signal may have lower power and higher frequency. The higher frequency signal may provide higher resolution for defect detection. In some embodiments, the signal bandwidth of the photoconductive switch of the contactless test probe is variable to accommodate different signal bandwidths for the test signal.

Figure 6:
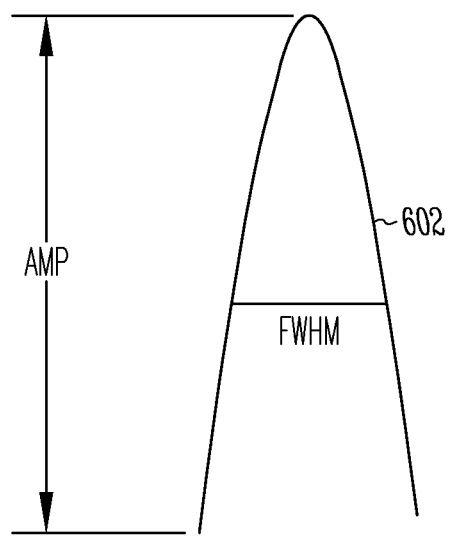
FIG. 6 illustrates examples of test signals that can be used for defect isolation in packaged electronic devices.
Figure 6:
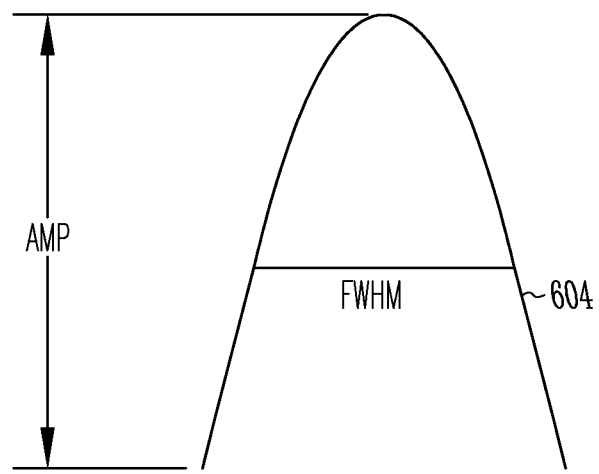

FIG. 6 illustrates examples of test signals that can be used for defect isolation in packaged complex electronic devices. The top waveform 602 shows a small full width half maximum (FWHM) signal to achieve high resolution fault isolation. This signal corresponds to a signal with high frequency bandwidth. The bottom waveform 604 shows a wide FWHM signal to achieve long distance fault isolation. This signal corresponds to a signal low frequency bandwidth.

In some embodiments, combinations of tests signals may be used to isolate defects. The higher power and low frequency test signal can be used to sweep the electronic package to search for a defect. The higher frequency signal can be used for a high resolution test at a particular component. For example, application of the low frequency test signal may uncover a defect at IC Die #1. The higher frequency signal can be applied at IC Die #1 to provide more detailed waveform signatures of the FLI and other design elements of IC Die #1 to identify the defective feature. Thus, combinations of different types of test signals can be used to provide feature-based fault isolation.

In some embodiments, the device 500 includes a user interface 530 to receive input from a user to select a type of signal to apply to the DUT. The user interface 530 can include one or more of a keyboard, keypad, computer mouse, display, touch sensitive display to receive the input. In some embodiments, the device 500 includes a test control circuit 535 electrically coupled to the test signal emitter circuit 520. The test control circuit 535 automatically determines a measure of test signal travel distance between the first location of the DUT where the test signal is applied, and the second location of the DUT where the impulse signal is positioned. The test control circuit 535 may then select one or both of a signal power and a signal frequency bandwidth of the test signal according to the determined measure of test signal travel distance. The test control circuit may adjust the bandwidth of the photoconductive switch 525 according to the selected test signal.

The emitter probe 505 may contact the DUT when the test signal is applied to the DUT. In some embodiments, the emitter probe 505 is a contactless emitter probe electrically coupled to the test signal emitter circuit 520. The contactless emitter probe may electromagnetically couple the test signal to a conductive trace or other conductive structure of the DUT.

In certain embodiments, the emitter probe 505 is an electro-optic contactless emitter probe. The emitter probe 505 may include a second photoconductive switch 540 that converts an optical test signal into an electrical test signal, and the converted electrical test signal is applied to a conductor of the DUT through electromagnetic coupling. The optical test signal may be a laser signal. The frequency of the test signal applied by the emitter probe 505 may include a lock-in frequency of the laser signal. In some embodiments, the device 500 includes an optical beam control network configured to split a laser beam received from a laser source 555 into the optical sense signal and the optical test signal. The electro-optic contactless emitter probe may include an optical fiber to receive the optical test signal from the optical beam control network 550.

Figure 7:
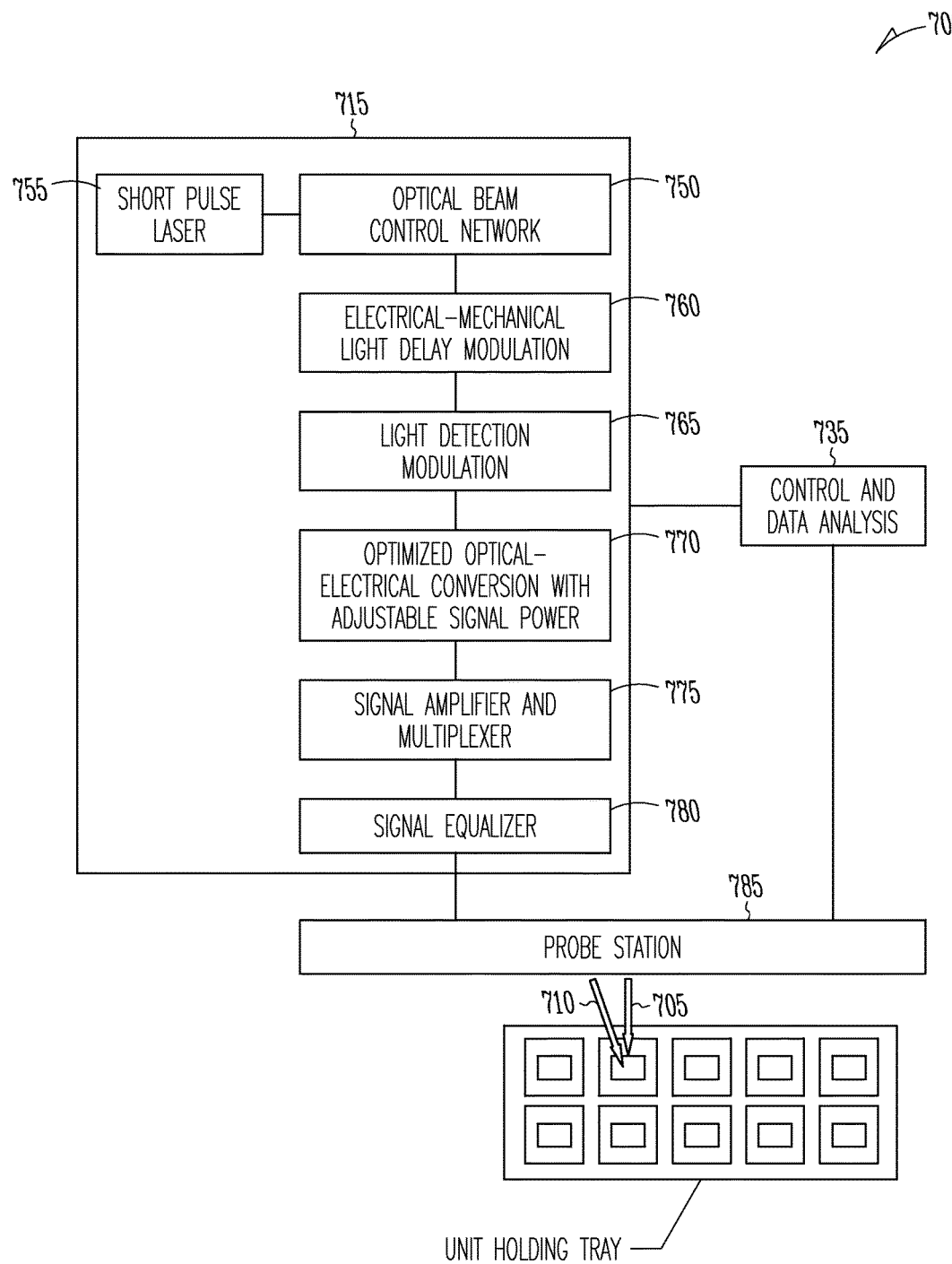
FIG. 7 is a block diagram of an example of a system for detecting defects in a device under test.

FIG. 7 is a block diagram of an example of a system for detecting defects in a DUT. The system 700 includes an emitter probe 705 and an electro-optic contactless sense probe 710. The probes are coupled to a probe station 785 that manipulates the probes to different positions of the devices under test. The system 700 includes a test control unit 735 that provides control signals to the probe station 785 and provides automatic test signal selection for the testing.

The system 700 also includes an electro-optic sensor module 715. The electro-optic sensor module 715 includes an optical beam control network 750 that receives a laser signal from a short pulse laser source 755. The system 700 includes an electrical-mechanical light delay modulation unit 760. The electrical-mechanical light delay modulation unit 760 converts the laser signal into an optical impulse signal. The optical impulse signal may be modulated by the test signal at the light detection modulation unit 765.

The system 700 can include an optimized optical-electrical conversion unit 770 that increases signal power and may include adjustable bandwidth for the optical-electrical conversion. The modulation of the sense signal by the test signal can be detected using an electrical signal converted from the optical signal. The system 700 can include a test signal amplifier and multiplexer unit 775 to increase signal power and select different combinations of test signal power and bandwidth according to one or both of the signal travel distance and the structure to be tested. The system 700 can include a signal equalizer 780 that optimizes signal strength and resolution balance of the sensed impulse signal.

The embodiments described herein improve testing, debug, and failure analysis of complex electronic packages such as among other things processor units, chipsets, graphics processing units, and wireless devices without destructive analysis of the packages. Test signal customization and analysis can provide feature-based fault isolation.

Additional Description and Examples

Example 1 can include subject matter (such as an apparatus) comprising a contactless sense probe including a first photoconductive switch, wherein a signal bandwidth of the first photoconductive switch is variable; an electro-optic sensor module coupled to the contactless sense probe and configured to generate an impulse signal at the contactless sense probe using an optical signal input to the first photoconductive switch; and a test signal emitter circuit configured to apply a test signal to a device under test (DUT) at a first location of the DUT, wherein the test signal includes a test signal frequency. The electro-optic sensor module is optionally further configured to sense the test signal frequency in the impulse signal using the contactless sense probe at a second location of the DUT and generate an indication of a defect in the DUT when the test signal frequency is undetected in the impulse signal.

In Example 2, the subject matter of Example 1 optionally includes a test control circuit electrically coupled to the test signal emitter circuit and configured to: determine a measure of test signal travel distance between the first location of the DUT and the second location of the DUT; and select one or both of a signal power and a signal frequency bandwidth of the test signal according to the determined measure of test signal travel distance.

In Example 3, the subject matter of one or both of Examples 1 and 2 optionally includes a contactless emitter probe electrically coupled to the test signal emitter circuit, wherein the contactless emitter probe is configured to electromagnetically couple the test signal to the DUT at the first location.

In Example 4, the subject matter of one or any combination of Examples 1-3 optionally includes a test signal emitter circuit that includes a second photoconductive switch configured to convert an optical test signal into an electrical test signal, and wherein the test signal emitter circuit is configured to apply the electrical test signal to the DUT at the first location.

In Example 5, the subject matter of Example 4 optionally includes an optical test signal is a laser signal, and wherein the test signal frequency includes a lock-in frequency of the laser signal.

In Example 6, the subject matter of one or both of Examples 4 and 5 optionally includes an optical beam control network configured to split a received laser beam into the optical sense signal and the optical test signal.

In Example 7, the subject matter of one or any combination of Examples 1-6 optionally includes an electro-optic sensor module includes a comparison circuit configured to compare a sensed impulse signal to a baseline sense signal expected from a DUT without defect, and generate the indication of a defect when the sensed impulse signal differs from the baseline signal by more than a threshold signal difference.

In Example 8 the subject matter of one or any combination of Examples 1-7 optionally includes a contactless sense probe that is an electro-optic contactless probe.

In Example 9, the subject matter of one or any combination of Examples 1-8 optionally includes a contactless sense probe configured to receive the optical signal and reflect at least a portion of the optical signal at a reflecting surface of the contactless sense probe; and provide a reflected optical signal to the to the first photoconductive switch.

In Example 10, the subject matter of one or any combination of Examples 1-9 optionally includes a contactless sense probe repositionable to multiple locations of the DUT, wherein the electro-optic sensor module is configured to detect one or more defects in the DUT when the test signal frequency is undetected in the impulse signal at the multiple locations.

Example 11 can include subject matter (such as a method, a means for performing acts, or a machine-readable medium including instructions that, when performed by the machine, cause the machine to perform acts), or can optionally be combined with the subject matter of one or any combination of Examples 1-10 to include such subject matter, comprising generating an electrical impulse signal at a contactless sense probe using an optical signal input through a photoconductive switch, wherein a signal bandwidth of the photoconductive switch is variable; applying a test signal to a device under test (DUT) at a first location of the DUT, wherein the test signal includes a test signal frequency; sensing the test signal frequency in the electrical impulse signal at a second location of the DUT using the contactless sense probe; and generating an indication of a defect in the DUT when the test signal frequency is undetected in the electrical impulse signal of a contactless sense probe at a second location of the DUT.

In Example 12, the subject matter of Example 11 can optionally include determining a distance between the first location of the DUT and the second location of the DUT, and selecting one or both of a signal power and a signal bandwidth of the test signal according to the distance between the first location of the DUT and the second location of the DUT.

In Example 13, the subject matter of one or both of Examples 11 and 12 can optionally include electromagnetically coupling the test signal to the DUT at the first location using a contactless emitter probe.

In Example 14, the subject matter of Example 13 can optionally include generating the test signal using a laser signal input to a second photoconductive switch, wherein the test signal frequency includes a lock-in frequency of the laser signal; and generating an electrical test signal using the laser signal, wherein applying the test signal includes applying the generated electrical test signal to the DUT.

In Example 15, the subject matter of one or any combination of Examples 11-14 can optionally include detecting phase modulation by the test signal present in the electrical impulse signal.

In Example 16, the subject matter of one or any combination of Examples 11-15 can optionally include including converting an optical impulse signal to the electrical impulse signal, and wherein the test signal phase modulates the optical impulse signal.

In Example 17, the subject matter of one or any combination of Examples 11-16 optionally includes comparing a sensed electrical impulse signal to a baseline sense signal expected from a DUT without defect, and generating the indication of a defect when the sensed electrical impulse signal differs from the baseline signal by more than a threshold signal difference.

In Example 18, the subject matter of one or any combination of Examples 11-17 optionally includes generating an optical impulse signal at the second location using an electro-optic contactless probe.

In Example 19, the subject matter of one or any combination of Examples 11-18 optionally includes scanning multiple locations of the DUT using the impulse signal and detecting one or more defects in the DUT when the test signal frequency is undetected in the electrical impulse signal at the multiple locations.

In Example 20, the subject matter of one or any combination of Examples 11-19 optionally includes detecting a flaw in at least one of first level interconnect (FLI) or midlevel interconnect (MLI) of the DUT according to the comparison.

Example 21 can include subject matter (such as an apparatus), or can optionally be combined with the subject matter of one or any combination of Examples 1-20 to include such subject matter, comprising an electro-optic contactless sense probe including a first photoconductive switch, wherein a signal bandwidth of the first photoconductive switch is variable; an electro-optic sensor module coupled to the contactless sense probe and configured to generate an impulse signal at the contactless sense probe using an optical signal input to the first photoconductive switch; an emitter probe including a test signal emitter circuit configured to apply a test signal to a device under test (DUT) at a first location of the DUT, wherein the test signal includes a test signal frequency; and an electro-optic sensor module coupled to the contactless sense probe and configured to: generate an impulse signal at the contactless sense probe using an optical signal input to the first photoconductive switch; and sense the test signal frequency in the impulse signal using the contactless sense probe at a second location of the DUT and generate an indication of a defect in the DUT when the test signal frequency is undetected in the impulse signal.

In Example 22, the subject matter of Example 21 can optionally include a test control circuit electrically coupled to the test signal emitter circuit and configured to: determine a measure of test signal travel distance between the first location of the DUT and the second location of the DUT; and select one or both of a signal power and a signal frequency bandwidth of the electrical test signal according to the determined measure of test signal travel distance.

In Example 23, the subject matter of one or both of Examples 21 and 22 optionally includes an electro-optic contactless probe includes an optical fiber to provide an incident optical signal to a reflecting surface, wherein the reflecting surface is configured to reflect at least a portion of the incident optical signal to generate the optical sense signal.

In Example 24, the subject matter of Example 23 optionally includes a photoconductive switch configured to receive the reflected portion of the incident optical signal and convert the reflected portion of the incident optical signal into an electrical sense signal, wherein the electro-optic sensor module is configured to compare a change in the electrical sense signal to the expected signal change.

In Example 25, the subject matter of one or any combination of Example 21-24 optionally includes an emitter probe includes a photoconductive switch configured to receive an optical test signal and convert the optical test signal into an electrical test signal that electromagnetically couples to the DUT.

In Example 26, the subject matter of one or any combination of Examples 21-25 optionally includes an electro-optic contactless probe that is movable to apply the optical sense signal to multiple scan locations of the DUT, wherein the electro-optic sensor module is configured to detect one or more defects in the DUT when the electrical test signal fails to modify the optical test signal at one or more of the multiple scan locations.

Example 27 can include, or can optionally be combined with any portion or combination of any portions of any one or more of Examples 1-26 to include, subject matter that can include means for performing any one or more of the functions of Examples 1-26, or a machine-readable medium including instructions that, when performed by a machine, cause the machine to perform any one or more of the functions of Examples 1-26.

These non-limiting examples can be combined in any permutation or combination.

The above detailed description includes references to the accompanying drawings, which form a part of the detailed description. The drawings show, by way of illustration, specific embodiments in which the invention can be practiced. These embodiments are also referred to herein as "examples." All publications, patents, and patent documents referred to in this document are incorporated by reference herein in their entirety, as though individually incorporated by reference. In the event of inconsistent usages between this document and those documents so incorporated by reference, the usage in the incorporated reference(s) should be considered supplementary to that of this document; for irreconcilable inconsistencies, the usage in this document controls.

Method examples described herein can be machine or computer-implemented at least in part. Some examples can include a computer-readable storage medium or machine-readable storage medium encoded with instructions operable to configure an electronic device to perform methods as described in the above examples. An implementation of such methods can include code, such as microcode, assembly language code, a higher-level language code, or the like. Such code can include computer readable instructions for performing various methods. The code may form portions of computer program products. The code can be tangibly stored on one or more volatile, non-transitory, or non-volatile tangible computer-readable media, such as during execution or at other times. Examples of these tangible computer-readable storage media can include, but are not limited to, hard disks, removable magnetic disks, removable optical disks (e.g., compact disks and digital video disks), magnetic cassettes, memory cards or sticks, random access memories (RAMs), read only memories (ROMs), and the like.

The Abstract is provided to comply with 37 C.F.R. Section 1.72(b) requiring an abstract that will allow the reader to ascertain the nature and gist of the technical disclosure. It is submitted with the understanding that it will not be used to limit or interpret the scope or meaning of the claims. The following claims are hereby incorporated into the detailed description, with each claim standing on its own as a separate embodiment. Also, in the following claims, the terms "including" and "comprising" are open-ended, that is, a system, device, article, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

What is claimed is:

1. An apparatus comprising:
a contactless sense probe including a first photoconductive switch, wherein a signal bandwidth of the first photoconductive switch is variable;
an electro-optic sensor module coupled to the contactless sense probe and configured to generate an impulse signal at the contactless sense probe using an optical signal input to the first photoconductive switch; and
a test signal emitter circuit configured to apply a test signal to a device under test (DUT) at a first location of the DUT, wherein the test signal includes a test signal frequency,
wherein the electro-optic sensor module is further configured to sense the test signal frequency in the impulse signal using the contactless sense probe at a second location of the DUT and generate an indication of a defect in the DUT when the test signal frequency is undetected in the impulse signal.

2. The apparatus of claim 1, a test control circuit electrically coupled to the test signal emitter circuit and configured to: determine a measure of test signal travel distance between the first location of the DUT and the second location of the DUT; and select one or both of a signal power and a signal frequency bandwidth of the test signal according to the determined measure of test signal travel distance.

3. The apparatus of claim 1, including a contactless emitter probe electrically coupled to the test signal emitter circuit, wherein the contactless emitter probe is configured to electromagnetically couple the test signal to the DUT at the first location.

4. The apparatus of claim 1, wherein the test signal emitter circuit includes a second photoconductive switch configured to convert an optical test signal into an electrical test signal, and wherein the test signal emitter circuit is configured to apply the electrical test signal to the DUT at the first location.

5. The apparatus of claim 4, wherein the optical test signal is a laser signal, and wherein the test signal frequency includes a lock-in frequency of the laser signal.

6. The apparatus of claim 4, including an optical beam control network configured to split a received laser beam into the optical sense signal and the optical test signal.

7. The apparatus of claim 1, wherein the electro-optic sensor module includes a comparison circuit configured to compare a sensed impulse signal to a baseline sense signal expected from a DUT without defect, and generate the indication of a defect when the sensed impulse signal differs from the baseline sense signal by more than a threshold signal difference.

8. The apparatus of claim 1, wherein the contactless sense probe is an electro-optic contactless probe.

9. The apparatus of claim 1, wherein the contactless sense probe is configured to receive the optical signal and reflect at least a portion of the optical signal at a reflecting surface of the contactless sense probe; and provide a reflected optical signal to the to the first photoconductive switch.

10. The apparatus of claim 1, wherein the contactless sense probe is repositionable to multiple locations of the DUT, wherein the electro-optic sensor module is configured to detect one or more defects in the DUT when the test signal frequency is undetected in the impulse signal at the multiple locations.

11. A method of controlling operation of a test device, the method comprising:
generating an electrical impulse signal at a contactless sense probe using an optical signal input through a photoconductive switch, wherein a signal bandwidth of the photoconductive switch is variable;
applying a test signal to a device under test (DUT) at a first location of the DUT, wherein the test signal includes a test signal frequency;
sensing the test signal frequency in the electrical impulse signal at a second location of the DUT using the contactless sense probe; and
generating an indication of a defect in the DUT when the test signal frequency is undetected in the electrical impulse signal of a contactless sense probe at a second location of the DUT.

12. The method of claim 11, including determining a distance between the first location of the DUT and the second location of the DUT, and selecting one or both of a signal power and a signal bandwidth of the test signal according to the distance between the first location of the DUT and the second location of the DUT.

13. The method of claim 11, wherein applying the test signal includes electromagnetically coupling the test signal to the DUT at the first location using a contactless emitter probe.

14. The method of claim 13, including generating the test signal using a laser signal input to a second photoconductive switch, wherein the test signal frequency includes a lock-in frequency of the laser signal; and generating an electrical test signal using the laser signal, wherein applying the test signal includes applying the generated electrical test signal to the DUT.

15. The method of claim 11, wherein detecting a change in the electrical impulse signal includes detecting phase modulation by the test signal present in the electrical impulse signal.

16. The method of claim 15, including converting an optical impulse signal to the electrical impulse signal, and wherein the test signal phase modulates the optical impulse signal.

17. The method of claim 11, wherein sensing the test signal frequency in the electrical impulse signal includes comparing a sensed electrical impulse signal to a baseline sense signal expected from a DUT without defect, and generating the indication of a defect when the sensed electrical impulse signal differs from the baseline signal by more than a threshold signal difference.

18. The method of claim 11, including generating an optical impulse signal at the second location of the DUT using an electro-optic contactless probe.

19. The method of claim 11, wherein detecting a change in the electrical impulse signal includes scanning multiple locations of the DUT using the impulse signal and detecting one or more defects in the DUT when the test signal frequency is undetected in the electrical impulse signal at the multiple locations.

20. The method of claim 11, including detecting a flaw in at least one of first level interconnect (FLI) or midlevel interconnect (MLI) of the DUT according to a comparison.

21. An apparatus comprising:
an electro-optic contactless sense probe including a first photoconductive switch, wherein a signal bandwidth of the first photoconductive switch is variable;
an electro-optic sensor module coupled to the contactless sense probe and configured to generate an impulse signal at the contactless sense probe using an optical signal input to the first photoconductive switch;
an emitter probe including a test signal emitter circuit configured to apply a test signal to a device under test (DUT) at a first location of the DUT, wherein the test signal includes a test signal frequency; and
the electro-optic sensor module further configured to sense the test signal frequency in the impulse signal using the electro-optic contactless sense probe at a second location of the DUT and generate an indication of a defect in the DUT when the test signal frequency is undetected in the impulse signal.

22. The apparatus of claim 21, a test control circuit electrically coupled to the test signal emitter circuit and configured to: determine a measure of test signal travel distance between the first location of the DUT and the second location of the DUT; and select one or both of a signal power and a signal frequency bandwidth of an electrical test signal according to the determined measure of test signal travel distance.

23. The apparatus of claim 21, wherein the electro-optic sense contactless probe includes an optical fiber to provide an incident optical signal to a reflecting surface, wherein the reflecting surface is configured to reflect at least a portion of the incident optical signal to generate an optical sense signal.

24. The apparatus of claim 23, wherein the first photoconductive switch is configured to receive the reflected portion of the incident optical signal and convert the reflected portion of the incident optical signal into an electrical sense signal, wherein the electro-optic sensor module is configured to compare a change in the electrical sense signal to an expected signal change.

25. The apparatus of claim 21, wherein the emitter probe includes a second photoconductive switch configured to receive an optical test signal and convert the optical test signal into an electrical test signal that electromagnetically couples to the DUT.

* * * * *

UNITED STATES PATENT AND TRADEMARK OFFICE
CERTIFICATE OF CORRECTION

PATENT NO. : 9,817,028 B2
APPLICATION NO. : 14/866221
DATED : November 14, 2017
INVENTOR(S) : Xie et al.

Page 1 of 1

It is certified that error appears in the above-identified patent and that said Letters Patent is hereby corrected as shown below:

In the Claims

In Column 12, Line 5, in Claim 9, delete "to the to the" and insert --to the-- therefor Signed and Sealed this
Eighteenth Day of June, 2019

Andrei Iancu
*Director of the United States Patent and Trademark Office*